(12) United States Patent
Feight et al.

(10) Patent No.: US 6,822,576 B1
(45) Date of Patent: Nov. 23, 2004

(54) MICROPROCESSOR CONTROLLED FAULT DETECTOR WITH CIRCUIT OVERLOAD CONDITION DETECTION

(75) Inventors: Laurence Virgil Feight, Island Lake, IL (US); Kurt James Fenske, Gleason, WI (US)

(73) Assignee: E.O. Schweitzer Manufacturing Company, Inc., Mundelein, IL (US)

( * ) Notice: Subject to any disclaimer, the term of this patent is extended or adjusted under 35 U.S.C. 154(b) by 0 days.

(21) Appl. No.: 10/280,328

(22) Filed: Oct. 25, 2002

Related U.S. Application Data

(60) Provisional application No. 60/337,632, filed on Oct. 26, 2001.

(51) Int. Cl.[7] ............................................. G08B 21/00
(52) U.S. Cl. ..................... 340/664; 340/649; 340/657; 340/691.1; 340/815.4; 324/503; 324/509; 324/525
(58) Field of Search ................................ 340/664, 663, 340/662, 660, 659, 652, 649, 646, 638, 657, 635, 647, 650, 651, 653, 691.1, 815.4; 324/503, 509, 512, 522, 525

(56) References Cited

U.S. PATENT DOCUMENTS

| | | | |
|---|---|---|---|
| 3,676,740 A | | 7/1972 | Schweitzer, Jr. |
| 3,906,477 A | | 9/1975 | Schweitzer, Jr. |
| 4,063,171 A | | 12/1977 | Schweitzer, Jr. |
| 4,234,847 A | | 11/1980 | Schweitzer, Jr. |
| 4,438,403 A | | 3/1984 | Schweitzer, Jr. |
| 4,456,873 A | * | 6/1984 | Schweitzer, Jr. ............ 324/133 |
| 4,495,489 A | * | 1/1985 | Schweitzer, Jr. ............ 340/664 |
| 4,788,619 A | * | 11/1988 | Ott et al. ..................... 340/663 |
| 5,677,678 A | * | 10/1997 | Schweitzer, Jr. ............ 340/664 |
| 6,016,105 A | * | 1/2000 | Schweitzer, Jr. ............ 340/664 |
| 6,133,723 A | * | 10/2000 | Feight ......................... 324/133 |
| 6,133,724 A | * | 10/2000 | Schweitzer, Jr. et al. ... 324/133 |

* cited by examiner

*Primary Examiner*—Jeffery Hofsass
*Assistant Examiner*—Daniel Previl
(74) *Attorney, Agent, or Firm*—Cook, Alex, McFarron, Manzo, Cummings & Mehler, Ltd.

(57) ABSTRACT

A fault indicator for monitoring an electrical conductor has a housing, an indicator flag or a light emitting diode (LED) that becomes visible from the exterior of the fault indicator upon the occurrence of a fault, and electronic circuitry for sensing a fault, for actuating the indicator flag or LED to a fault indicating condition and for resetting the indicator flag or LED to a non-fault indicating condition a predetermined time after the fault has occurred. An overload indicator provides an overload indication, such as a fast flash rate, for a predetermined time when an overload threshold is exceeded, and provides a different overload indication, such as a slow flash rate, for a predetermined time when the line current in the monitored conductor falls below the threshold.

18 Claims, 8 Drawing Sheets

FIG. 12
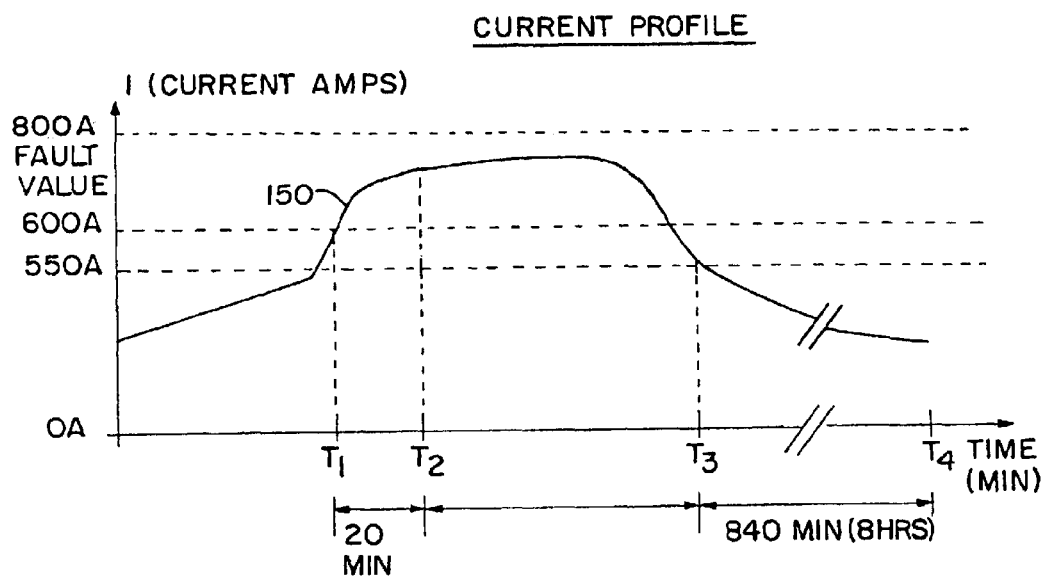
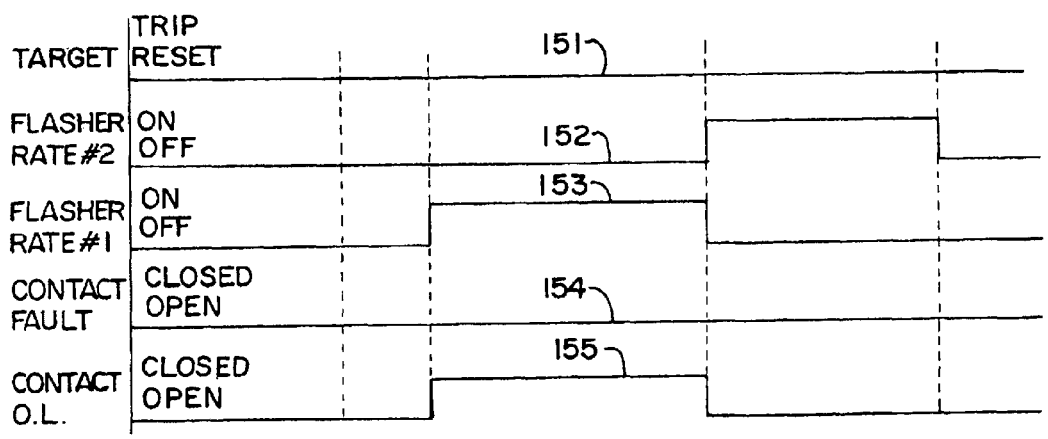

FIG. 13
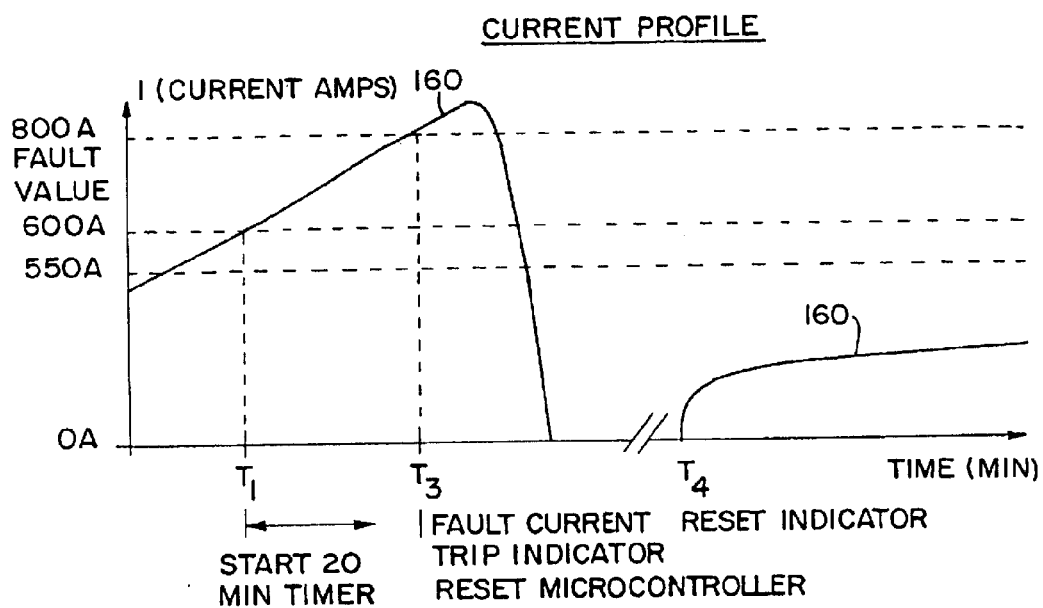
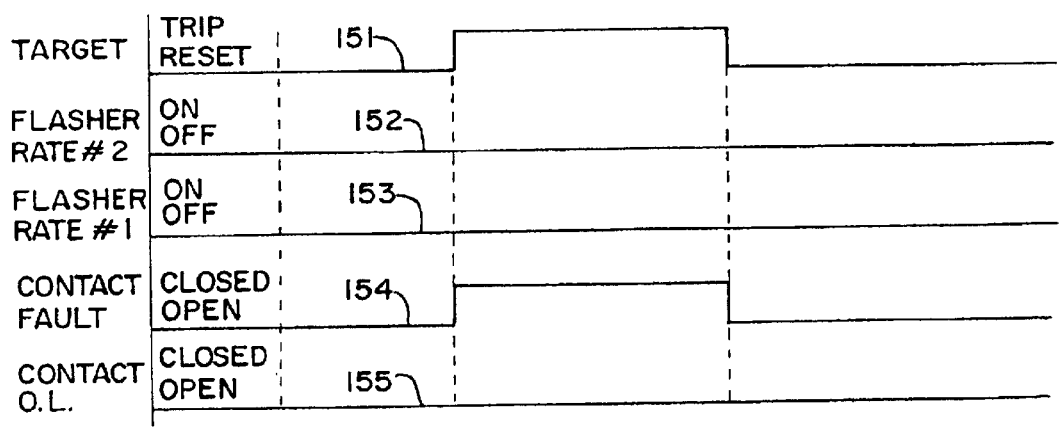

_MICROPROCESSOR CONTROLLED FAULT DETECTOR WITH CIRCUIT OVERLOAD CONDITION DETECTION_

CROSS-REFERENCE TO RELATED APPLICATIONS

This patent application is a non-provisional application of U.S. provisional patent application Ser. No. 60/337,632 filed on Oct. 26, 2001. This patent application is also related to the following non-provisional patent applications filed concurrently herewith: Microprocessor Controlled Fault Indicator with Battery Conservation Mode, Ser. No. 10/280,322; Microprocessor Fault Indicator Having LED Fault Indication Circuit with Battery Conservation Mode, Ser. No. 10/280,219; Microprocessor Fault Indicator Having High Visibility LED Fault Indication, Ser. No. 10/280,141; Microprocessor Controlled Fault Indicator Having Inrush Restraint Circuit, Ser. No. 10/280,329; Microprocessor Controlled Directional Fault Indicator, Ser. No. 10/280,195, all filed on Oct. 25, 2002, and all incorporated by reference herein, in their entireties.

BACKGROUND OF THE INVENTION

The present invention relates generally to current sensing devices for electrical systems, and more particularly to timed reset fault indicators for alternating current power systems.

Various types of self-powered fault indicators have been constructed for detecting electrical faults in power distribution systems, including clamp-on type fault indicators, which clamp directly over cables in the systems and derive their operating power from inductive coupling to the monitored conductor, and test point type fault indicators, which are mounted over test points on cables or associated connectors of the systems and derive their operating power from capacitive coupling to the monitored conductor. Such fault indicators may be either of the manually resetting type, wherein it is necessary that the indicators be physically reset, or of the self-resetting type, wherein the indicators are reset upon restoration of line current. Examples of such fault indicators are found in products manufactured by E.O. Schweitzer Manufacturing Company of Mundelein, Ill., and in U.S. Pat. Nos. 3,676,740, 3,906,477, 4,063,171, 4,234, 847, 4,375,617, 4,438,403, 4,456,873, 4,458,198, 4,495,489, 4,974,329, 5,677,678, 6,016,105, 6,133,723 and 6,133,724.

Detection of fault currents in a monitored conductor by a fault indicator is typically accomplished by magnetic switch means, such as a magnetic reed switch, in close proximity to the conductor being monitored. Upon occurrence of an abnormally high fault-associated magnetic field around the conductor, the magnetic switch actuates a trip circuit that produces current flow in a trip winding to position an indicator flag visible from the exterior of the indicator to a trip or fault indicating position. Upon restoration of current in the conductor, a reset circuit is actuated to produce current flow in a reset winding to reposition the target indicator to a reset or non-fault indicating position.

Some prior art fault indicators utilize light emitting diodes (LEDs) to display a fault condition. However, LEDs require a source of power, such as an internal battery. Even if the LEDs are controlled to flash intermittently, the intermittent current drain from the internal battery is not insubstantial, and periodic replacement of the battery is required.

In certain other applications, the need arises for a fault indicator which will continue to display a prior fault condition for a predetermined amount of time, such as in the range of one hour to twenty-four hours, rather than self-resetting upon restoration of current in the conductor. The fault indicator should be capable of self-resetting after termination of the predetermined time.

Some of these applications also require voltage in-rush restraint and/or current in-rush restraint to prevent false tripping due to voltage and/or current surges, such as when a reclosing relay of a power distribution system closes.

In certain of these applications, the need also arises for auxiliary contacts in the fault indicator for indicating or recording the detection of a fault current at a location remote from the fault indicator. For example, where fault indicators are installed in each of multiple distribution circuits fed from a common source, it may be desirable to monitor the fault indicators at a central monitoring facility to enable a fault to be quickly isolated. Repair crews can then be efficiently dispatched to the known location of the fault.

Because of the compact construction and limited power available in self-powered fault indicators, it is preferable that the desired functions of the fault indicator be accomplished with minimal structure and with internal circuitry that has minimal current drain on a high capacity battery. The fault indicator must also provide highly reliable and extended operation over a number of years.

Because fault indicators only trip when some high current level, such as 600 or 800 amperes, is exceeded, there is a need for a fault indicator that can forewarn of overload conditions, such as greater than 500 to 600 amperes, on a monitored conductor. Of course, such overload conditions could cause the fault indicator to indicate a fault on the conductor if the overload increases to the trip point of the fault indicator, when in fact, no fault condition exists.

There is a further need for such an overload indicating fault indicator that operates from energy coupling to the monitored conductor, i.e., operates without the need for a battery.

Accordingly, it is a general object of the present invention to provide a new and improved fault indicator for detecting and indicating an overload indication.

Another object of the present invention is to provide a fault indicator with an overload indicator that provides a first indication for a predetermined time after an overload threshold has been exceeded.

A further object of the present invention is to provide a fault indicator with an overload indicator that provides a second indication for a predetermined time after the current load on the monitored conductor fall below the overload threshold.

Yet another object of the present invention is to provide such a fault indicator with in-rush restraint to avoid false tripping on line surges.

A further object of the present invention is to provide such a fault indicator with auxiliary contacts to provide contact closure indicative of fault occurrence and overload occurrence.

SUMMARY OF THE INVENTION

This invention is directed to a fault indicator for indicating the occurrence of a fault current in an electrical conductor. The fault indicator has a housing, an indicator flag or a light emitting diode (LED) that becomes visible from the exterior of the fault indicator upon the occurrence of a fault and which may be reset to a non-fault indicating condition after the occurrence of the fault, and electronic circuitry for sensing a fault, for actuating the indicator flag or LED to a fault indicating position and for resetting the indicator flag or LED to a non-fault indicating position a predetermined time after the fault has occurred. An overload indicator provides an overload indication, such as a fast flash rate, when an overload threshold is exceeded, and provides a different overload indication, such as a slow flash rate, when the line current in the monitored conductor falls below the threshold. The electronic circuitry may also include voltage in-rush restraint and/or current in-rush restraint to avoid false tripping of the fault indicator during voltage and/or current surges. Auxiliary contacts also provide an indication of This invention is directed to a fault indicator for indicating the occurrence of a fault current in an electrical conductor. The fault indicator has a housing, an indicator flag or a light emitting diode (LED) that becomes visible from the exterior of the fault indicator upon the occurrence of a fault and which may be reset to a non-fault indicating condition after the occurrence of the fault, and electronic circuitry for sensing a fault, for actuating the indicator flag or LED to a fault indicating position and for resetting the indicator flag or LED to a non-fault indicating position a predetermined time after the fault has occurred. An overload indicator provides an overload indication, such as a fast flash rate, when an overload threshold is exceeded, and provides a different overload indication, such as a slow flash rate, when the line current in the monitored conductor falls below the threshold. The electronic circuitry may also include voltage in-rush restraint and/or current in-rush restraint to avoid false tripping of the fault indicator during voltage and/or current surges. Auxiliary contacts also provide an indication of any fault, such as to a remote location.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures in which like reference numerals identify like elements, and in which:

FIG. 12 is an example of a current profile on a monitored conductor that represents an overload condition and a timing diagram of the response of the electronic circuitry of FIG. 11 to this overload condition.

FIG. 13 is an example of a current profile on a monitored conductor that represents a fault condition and a timing diagram of the response of the electronic circuitry of FIG. 11 to this fault condition.

DESCRIPTION OF THE PREFERRED EMBODIMENT

Figure 1:
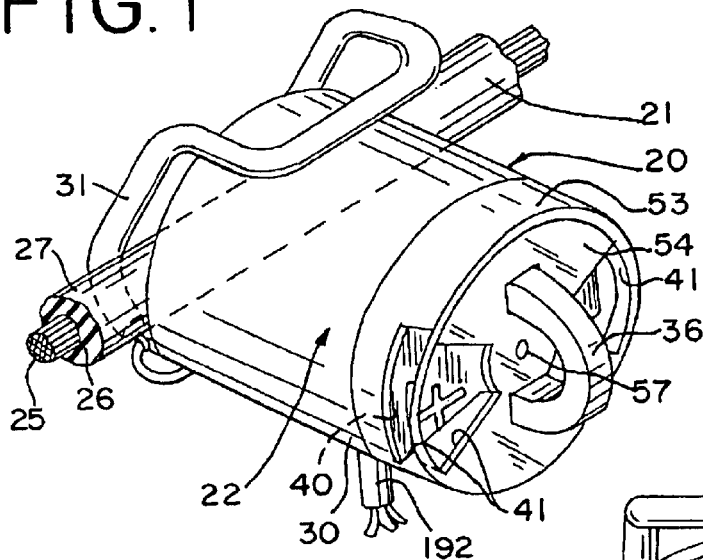
FIG. 1 is a perspective view of an electric field powered clamp-on fault indicator constructed in accordance with the invention and installed on a cable within a power distribution system with an indicator flag in the fault position.

Referring to the Figures, and particularly FIG. 1, a clamp-on timed reset fault indicator, generally designated 20, is constructed in accordance with the invention. Fault indicator 20 indicates fault currents in an electrical feeder or distribution cable, generally designated 21, and includes a circuit module, generally designated 22. In accordance with conventional practice, circuit module 22 is attached to the outer surface of the cable 21, which may include a central conductor 25, a concentric insulating layer 26 and an electrically grounded rubber outer sheath 27.

Circuit module 22 includes a housing 30 (FIG. 2) that contains electronic circuitry for sensing and responding to fault currents, such as on a printed circuit board 49. The structure and operation of this circuitry will be discussed below. A clamp assembly 31 is suited for attaching module 22 to a monitored conductor, such as cable 21. An eye 36 on an end cap 53 may be provided to allow use of a conventional hotstick during installation or removal of fault indicator 20 about cable 21. End cap 53 forms part of the housing 30, and may be sonically welded to housing 30 to seal the interior of fault indicator 20 against contamination.

In accordance with conventional practice, circuit module 22 also includes a status indicating flag 40 to indicate whether a fault has occurred on cable 21. The flag 40 may be viewed from the exterior of fault indicator 20 through one or more generally transparent windows 41 disposed on the front of the end cap 53 of the fault indicator. Indicator flag 40 includes two indicator segments on either side of the axis of rotation which preferably each extend less than 90 degrees around the axis of rotation. Thus, when in the reset condition, such as in FIG. 2, no portion of indicator flag 40 is visible through windows 41.

As illustrated in FIG. 1, windows 41 may also extend into the sides of end cap 53 for better viewing of indicator flag 40. In operation, during normal current flow in conductor 21, indicator flag 40 is positioned by circuitry in circuit module 22 to be out of view. To this end, portions 54 of end cap 53 are generally opaque to conceal the indicator flag 40 from view when in the reset condition. Upon occurrence of a fault current in a monitored conductor, the indicator flag 40 is repositioned by the circuitry to present a red or fault-indicating surface that may be viewed through the windows 41 on the front face of module 22. Thus, the red or other highly visible colored surface of indicator flag 40 is only visible following occurrence of a fault.

Figure 3:
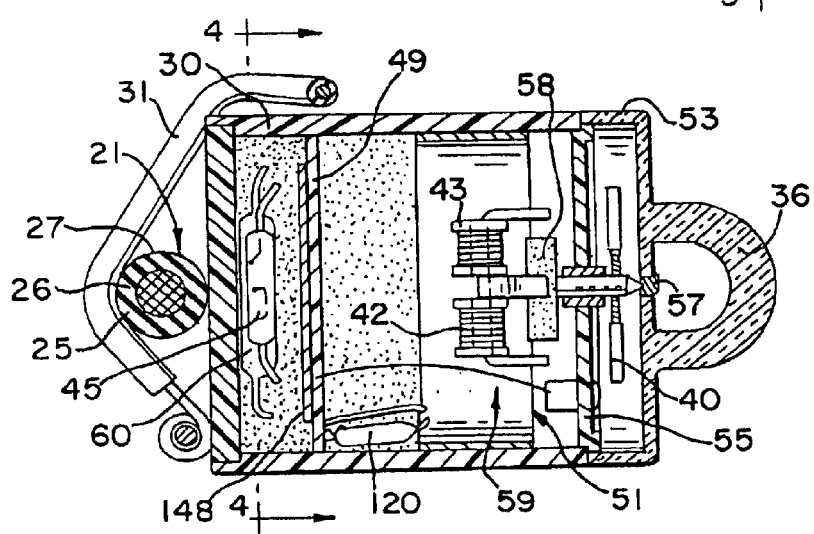
FIG. 3 is a cross-sectional view of the fault indicator of FIGS. 1 and 2 taken along the sectional line 3—3 of FIG. 2.
Figure 4:
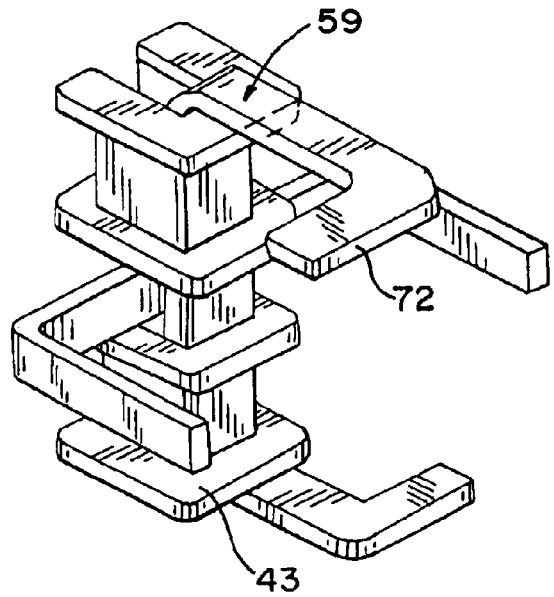
FIG. 4 is a perspective view of the assembled magnetic actuator of the indicator flag assembly.

With reference to FIG. 3, a partition 55 may be integral to housing 30 for rotatably supporting the indicator flag assembly including flag 40 and a flag actuator magnet 58. End cap 53 may be provided with a pivot point 57 for flag 40 to rotate about a generally horizontal axis, as seen in FIG. 3. Actuation of indicator flag 40 between reset and fault indicating positions is accomplished by flag actuator magnet 58 which is rotatably coupled to the flag by a shaft coupled to the flag 40. The shaft is maintained in alignment with the axis of the housing 30 by means of bearing surfaces disposed in partition 55 and pivot point 57.

Partition 55 also serves as a background for the windows 41 when flag 40 is in the reset position, and partition 55 may, for example, have a white surface to differentiate or contrast from the red color of flag 40 to clearly indicate a reset condition.

Figure 5:
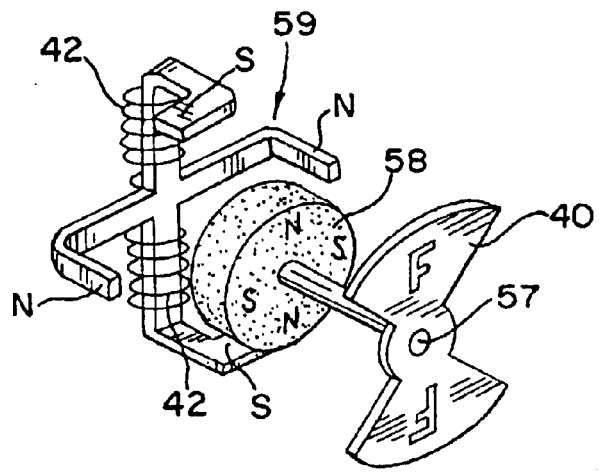
FIG. 5 is a diagrammatic view of the principal components of the indicator flag assembly in a reset indicating position.
Figure 6:
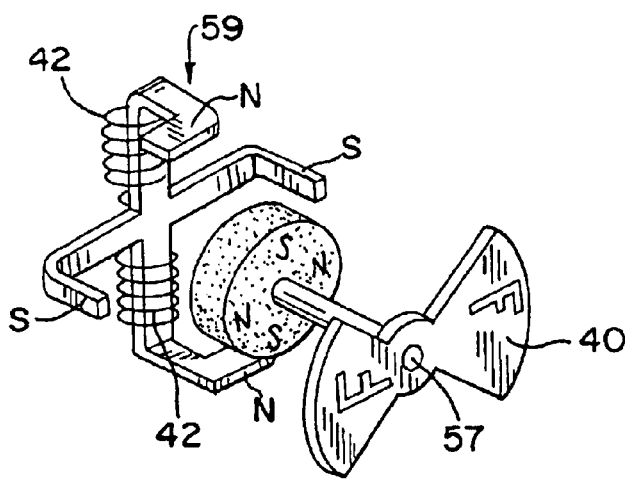
FIG. 6 is a diagrammatic view of the principal components of the indicator flag assembly in a fault indicating position.

The flag actuator magnet 58 (FIG. 5) is secured to and rotates with indicator flag 40. Flag actuator magnet 58 is formed of a magnetic material having a high coercive force, such as ceramic, and is magnetically polarized to form four magnetic poles of opposite polarity, as indicated in FIGS. 5 and 6, with like magnetic polarities along diameters of the magnet. That is, actuator magnet 58 has four poles of opposite polarity spaced at 90 degrees about the circumference of the magnet.

A four pole piece, generally designated 59 in FIGS. 3-6 is preferably formed of a magnetic material having a relatively low coercive force, such as chrome steel. The four poles of pole piece 59 are positioned to be in magnetic communication with flag actuator magnet 58. A wire winding 42 is wound on a bobbin 43 of pole piece 59.

Energization of winding 42 by current in one direction upon occurrence of a fault in conductor 21, and energization of winding 42 in the opposite direction upon a timed reset, is accomplished by means of circuitry contained within circuit module 22.

Operation of the indicator flag assembly is illustrated in FIGS. 5 and 6. The indicator flag assembly may be substantially identical in construction and operation to that described in U.S. Pat. Nos. 4,495,489 and 6,016,105. Actuator magnet 58 and hence indicator flag 40 are biased to the position and to the magnetic polarities shown in FIG. 5 when the fault indicator 20 is in a non-trip or reset condition by means of the generally cross-shaped magnetic pole piece 59. When the segments of the indicator flag 40 are vertically disposed as shown in FIG. 5, the flag segments are masked by the generally opaque segments 54 of the end cap 53 in FIG. 1. Thus, indicator flag 40 is not visible to the observer through windows 41.

However, upon detection of a fault in conductor 21, circuitry in circuit module 22 causes winding 42 of pole piece 59 to be momentarily energized which causes pole piece 59 to be remagnetized to the polarities shown in FIG. 6. As a result, the poles of flag actuator magnet 58 are repelled by adjacent like-polarity poles of the pole piece 59, and the indicator flag 40 is caused to rotate 90 degrees to the indicating position shown in FIG. 6. In this position, the red indicator segments of indicator flag 40 are visible through windows 41 and a lineman viewing the fault indicator is advised that a fault current has occurred in conductor 21.

The indicator flag 40 remains in the fault-indicating position shown in FIG. 6 until the poles of pole piece 59 are subsequently remagnetized back to the polarity shown in FIG. 5. A momentary reset current is applied to winding 42 after the lapse of a predetermined time, for example, a couple to several hours. The momentary reset current applied to winding 42 is in an opposite direction to that applied upon detecting the fault condition. This reset remagnetization of pole piece 59 causes flag actuator magnet 58 to again be repelled by the adjacent poles of pole piece 59 which causes actuator magnet 58 and indicator flag 40 to rotate and to resume the vertical position shown in FIG. 5. At this time, fault indicator 20 is reset and indicator flag 40 is no longer visible.

Magnetic shielding for the pole piece 59 and the indicator flag assembly, including actuator magnet 58, may be provided by a band 51 disposed on a significant portion of the inside circumference of the housing 30. If band 51 is formed from brass or steel, a significant degree of magnetic shielding may be provided to the internal components.

The fault indicator 20 preferably has a timed reset to reset some hours after a fault occurs. Thus, fault indicators 20 and 20*a* (FIGS. 7-9) continue to display the fault indicating flag 40 or a fault indicating LED 35 after a reclosing relay restores current to the main line. This enables a lineman to easily trace the fault by following the tripped fault indicators to a section of the line that has faulted. The point of the fault may then be located and repaired, or the line may be replaced. As will be understood hereinafter, the length of the timed reset may be in the range of 1 to 24 or more hours, and is preferably about 4 hours. Four hours normally provides sufficient time for a lineman or repair crew to review the tripped fault indicators to determine the part of the distribution system that has caused the fault.

Figure 7:
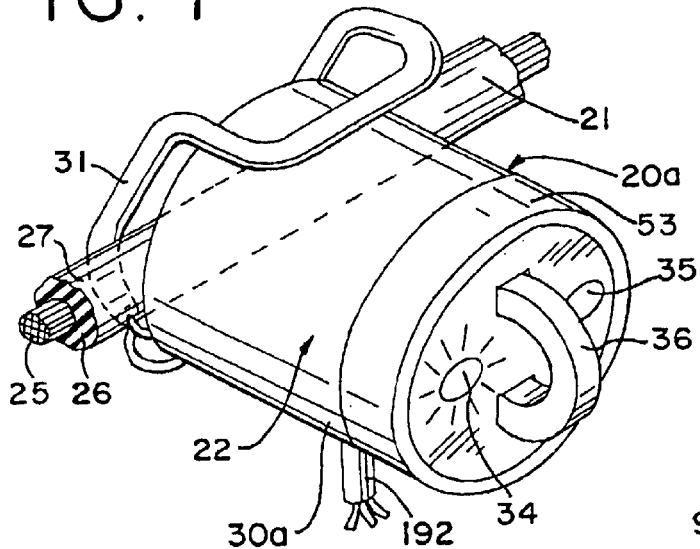
FIG. 7 is a perspective view of an alternate embodiment of an electric field powered clamp-on fault indicator that is constructed in accordance with the present invention and that may be installed on a cable within a power distribution system.
Figure 8:
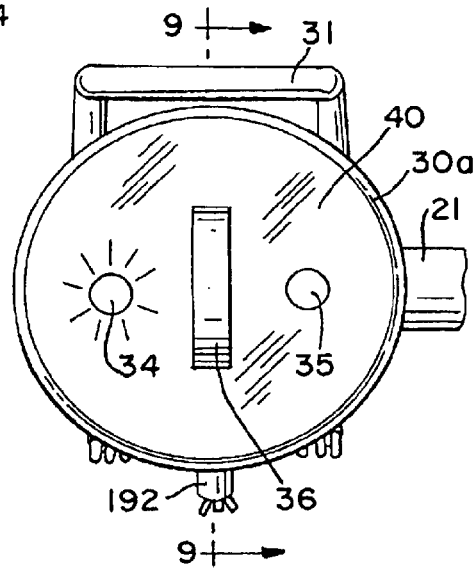
FIG. 8 is a front view of the fault indicator of FIG. 7 showing an illuminated LED to indicate the occurrence of an overload condition, and an LED that is not illuminated and that may be used to indicate a fault condition.
Figure 9:
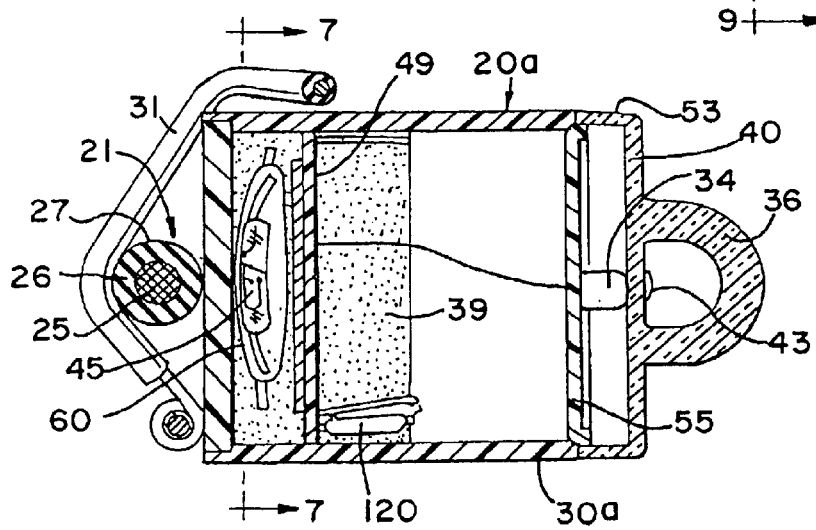
FIG. 9 is a cross-sectional view of the fault indicator of FIGS. 7 and 8 taken along the sectional line 9—9 of FIG. 8

Turning now to FIGS. 7-9 a fault indicator 20*a* is illustrated. Fault indicator 20*a* is an alternate embodiment of fault indicator 20 shown in FIGS. 1-3. Fault indicator 20*a* operates the similarly to fault indicator 20 except that fault indicator 20*a* displays a fault condition by illuminating an LED 35 instead of using the electromechanical arrangement of fault indicator 20, including flag 40.

In accordance with one aspect of the present invention, both fault indicators 20 and 20*a* include a sensor to sense an overload condition and a display, such as LED 33 in FIG. or LED 34 in FIGS. 7-9, to display the overload condition. LED 33 or 34 may be selected from any color commercially available. However, a color that is traditionally used for a warning, such as yellow is preferred. In the embodiment shown in FIGS. 6-9 with a fault indicating LED 35, it is preferable to have different colors for the different conditions. Since LED 35 is likely to be of a red color, it is preferable that LED 34 not also be red. This overload condition is below a fault condition that would cause fault indicators 20 or 20*a* to indicate a fault. For example, in a system where the fault indicator should trip to display a fault condition for currents above 600 A, the overload condition may be defined to be any load above 500 A.

Figure 10:
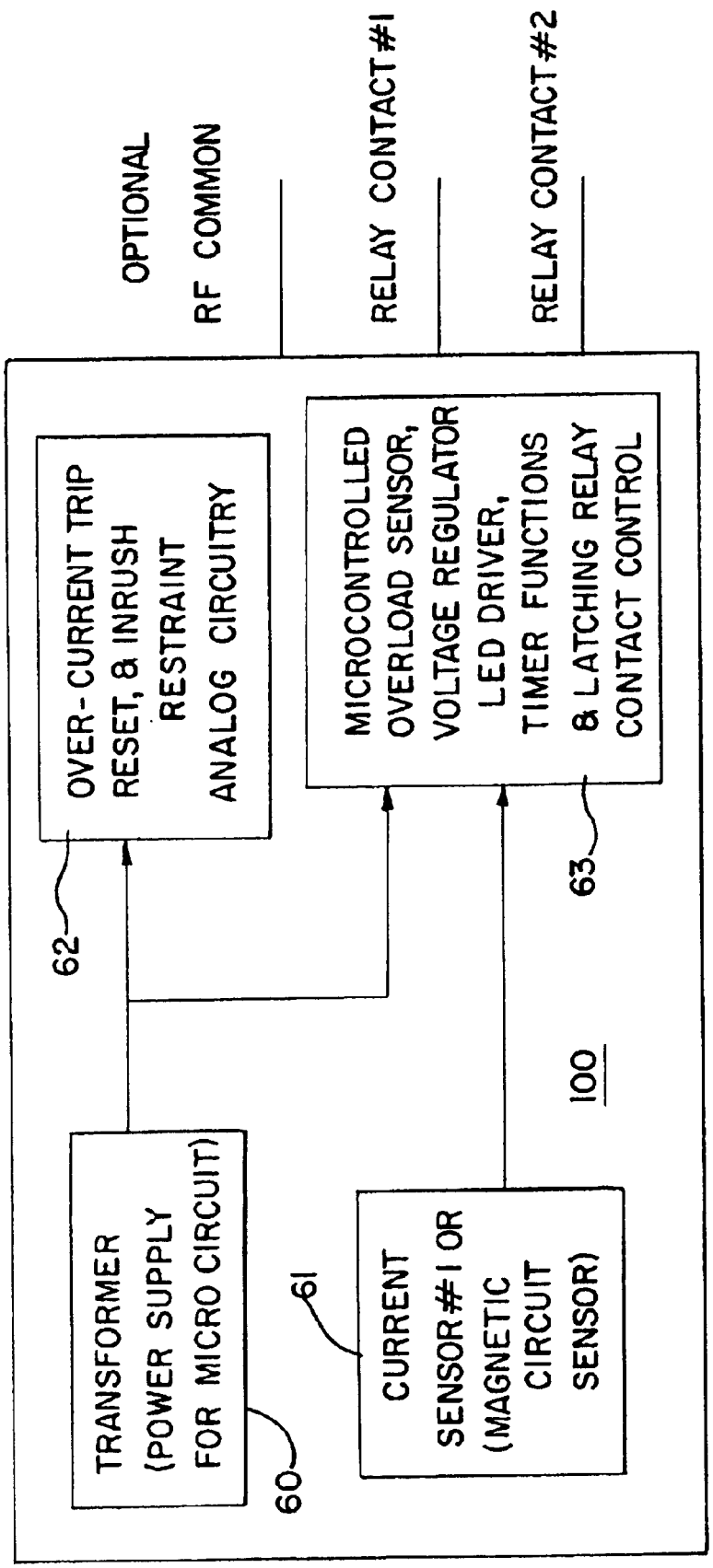
FIG. 10 is a functional block diagram of the electronic circuitry for use in the fault indicators shown in FIGS. 1-3 and 6-9.

A block diagram of the electronic circuitry for fault indicators 20 or 20*a* is shown in FIG. 10. A transformer 60 is disposed in an end of fault indicators 20 (FIG. 3) and 20*a* (FIG. 9) in relatively close proximity to conductor 21 to derive operating power for the electronic circuitry, generally designated 100, including that circuitry contained within blocks 62 and 63. A current sensor 61, which may be disposed adjacently to transformer 60 in close proximity to conductor 21, provides a signal to circuitry block 63 that is representative of the current load in conductor 21.

Figure 11:
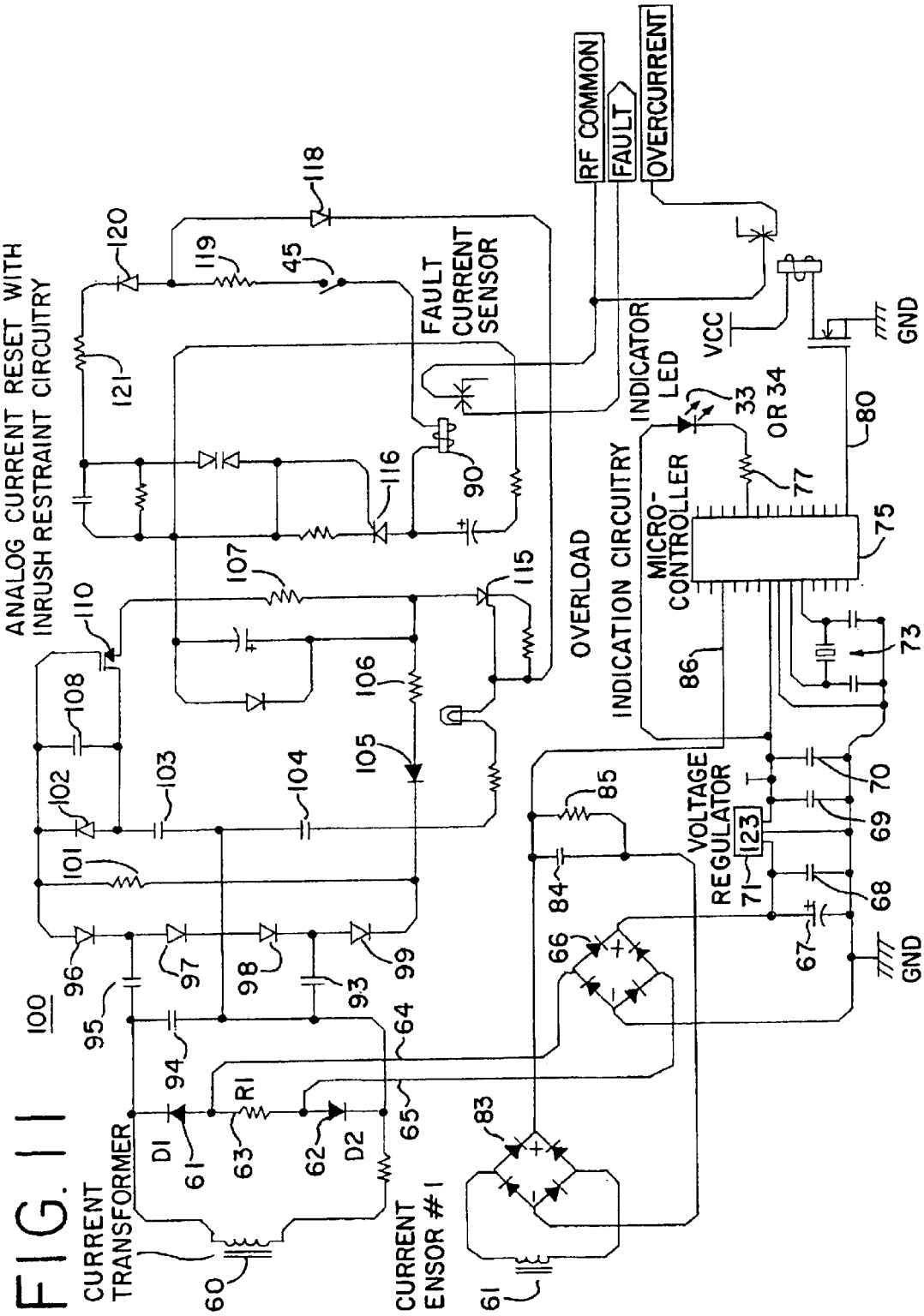
FIG. 11 is an electrical circuit diagram of the circuitry of the fault indicators shown in FIGS. 1-3 and 6-9.

The circuitry 100 is shown in greater detail in FIG. 11. A pair of Zener diodes 61 and 62 is arranged back-to-back, with a resistor 63 in between the Zener diodes, across the terminals of transformer 60. A pair of lines 64 and 65 provide the potential developed across resistor 63 to a full-wave rectification diode bridge 66. Capacitors 67–70 filter the DC voltage from bridge 66, and a voltage regulator 71 provides further regulation of the voltage supplied to a microprocessor 75. For example, this power circuit for microprocessor may be designed such that microprocessor 75 begins to be powered up when the current on monitored conductor 21 is about 50 A.

Microprocessor 75 has an oscillation circuit, generally designated 73, including a frequency crystal, to set the clock speed of the microprocessor. One output of microprocessor 75 is connected to LED 33 or 34 through a resistor 77, back to the supply voltage Vcc from voltage regulator 71. Thus, when microprocessor 75 pulls this output terminal low, LED 33 or 34 will be energized. Energization of LED 33 or 34 is indicative of an overload condition.

Any signals developed in current sensor 61 are full-wave rectified by a diode bridge 83. Resistor 84 and capacitor 85 filter this current sense signal before it is provided to microprocessor 75 on input line 86. This portion of the electronic circuitry 100 is preferably designed to cause microprocessor 75 to activate the overload indicating LED 33 or 34 when the desired overload threshold is reached, such as 600 A.

The inrush restraint circuit portion of electronic circuitry 100 will now be reviewed. Capacitors 93–95 and diodes 96–99 operate to quadruple the voltage across transformer 60 to a voltage in the range of 40 to 70 volts. Capacitor 104 charges up toward this potential. A diode 102 keeps a negative bias of about 0.7 volts across capacitor 108 and the source to gate junction to keep FET 110 normally in a non-conductive condition. When an inrush condition occurs, some of the energy of capacitor 104 is transferred to capacitor 108 causing the source to gate of FET 110 to be forward biased. FET 110 then conducts and discharges capacitor 104 through the path consisting of resistor 107, resistor 106 and Zener diode 105. At this time, capacitor 103 assists in keeping a positive bias on the gate of FET 110 to keep it in conduction. The low charge on capacitor 104, when in the inrush condition, will disable the fault sensing circuit.

Figure 2:
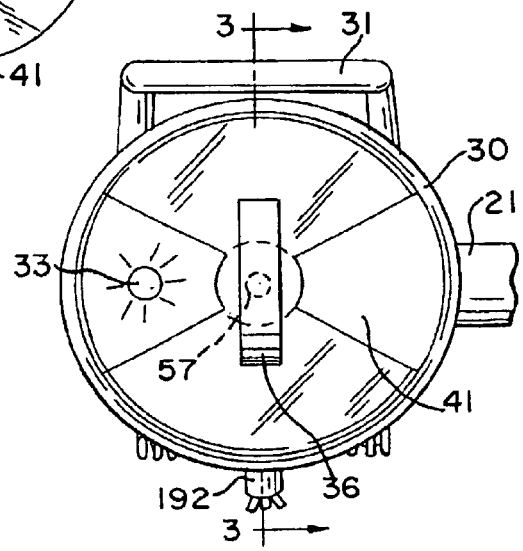
FIG. 2 is a front view of the fault indicator of FIG. 1 showing the indicator flag reset from the fault position to show a light emitting diode indicator for indicating an overload condition in accordance with the invention.

Thyristors 115 and 116 are used to supply the currents necessary for the electromagnetic circuitry to set and reset indicator flag 40 in the fault indicator 20 of FIGS. 1-3. Such circuitry is known to the prior art. For example, U.S. Pat. No. 6,016,105 is incorporated by reference herein, in its entirety.

A magnetic reed switch 45 is provided in the fault sensing circuitry. As seen in FIG. 1, magnetic reed switch 45 is positioned with its axis perpendicular to and spaced from the axis of conductor 21 to respond to fault currents in the conductor in a manner well known to the art. When magnetic reed switch 45 closes upon the occurrence of a fault current, relay 90 is energized to close its contacts thereby providing a fault signal at fault terminal 89.

With reference to FIG. 12, curve 150 represents a profile over time of the current in a monitored conductor. In this example, 600 A is the overload current threshold and 800 A is the fault trip threshold. When the load current reaches the overload threshold at T1, microprocessor preferably does not immediately cause LED 33 or 34 to indicate an overload condition, since such conditions may often be temporary. However, if the overload condition persists for about 20 minutes, in this example, LED 33 or 34 is activated to begin flashing at a first rate indicative of a present overload condition, as shown in the timing sequence by signal 153 changing to the on mode at time T2. At time T2, the overload contact signal 155 will also change to the closed mode, indicating that overload relay 79 has been activated by microprocessor 75 to cause overcurrent output 80 to provide an overload signal. At a later time, the load current drops below the 600 A threshold to about 550 A before microprocessor 75 determines that the overload condition is no longer in effect. At that time, T3, microprocessor causes LED 33 or 34 to flash at a second rate, as indicated by signal 152. This second rate of flashing may continue for about 8 hours, to indicate that an overload condition has occurred in the recent past. At time T3, the contacts on the overload relay 79 are opened and an overload signal is no longer present at output terminal 80. Note that since the fault threshold of 800 A was never exceeded, the target signal 151 was not tripped and the fault relay 90 was not energized to provide a fault signal on fault terminal 89.

Another example is provided in FIG. 13. In this example, load current quickly rises past the overload threshold of 600 A at time T1 to the fault threshold of 800 A at time T3. If the time between T1 and T3 is less than 20 minutes, fault indicators 20 and 20a will go into the fault mode. Of course, in the embodiment of FIG. 13, fault indicator 20 will have its flag 40 blocking view of overload indicating LED 33. Thus, LED 33 or 34 will not signal any overload condition, as shown in signals 152 and 153, nor will overload relay 79 be actuated to close its contacts, as represented by signal 155. However, as represented by signal 151, the fault indicator, flag 40 or LED 35, will be actuated to the fault indicating condition. Fault relay 90 will be actuated to provide a fault signal at fault terminal 89. When the fault condition ends by load current dropping below the fault threshold, fault indicators 40 and 35 will continue to display the fault condition for a predetermined time, such as to time T4.

Figure 14:
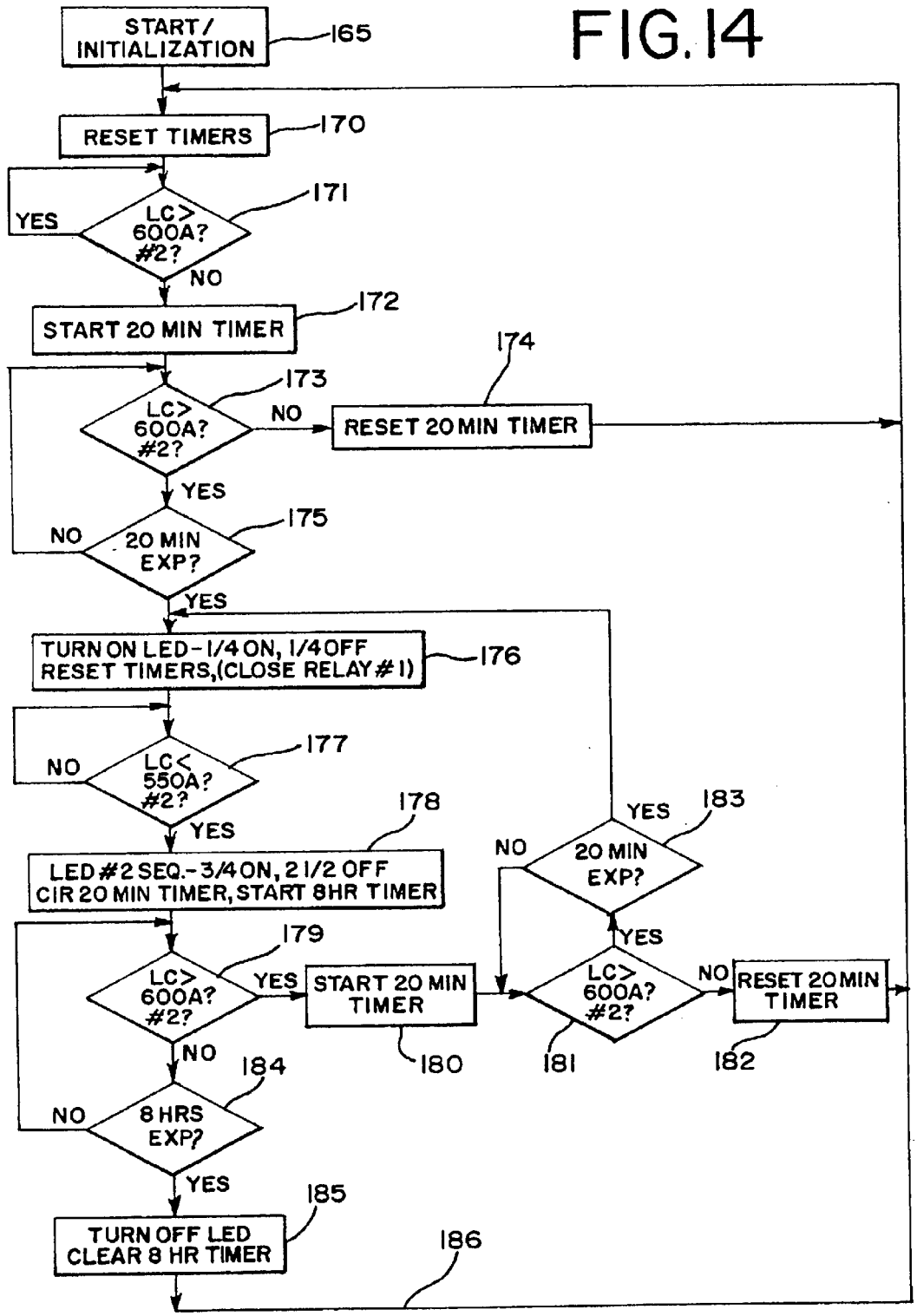
FIG. 14 is a flow chart illustrating typical steps that may be employed by a microprocessor during the various operational modes of the fault indicators with an overload indicator.

A flow chart for microprocessor 75 is shown in FIG. 14. After being initialized at block 165, the timers are reset at block 170. Decision block 171 determines if the load current is less than 600 A. If yes, it returns to continue sampling the load current. If the load current is greater than 600 A, a 20 minute timer is started at block 172. The load current is again sampled at decision block 173. If less than 600 A, the timer is reset at block 174 and returns to the start point. If the load current is greater than 600 A, decision block 175 determines if 20 minutes has expired. If not, the load current continues to be monitored at block 173.

If 20 minutes has expired at load currents above 600 A, microprocessor 75 turns on LED 33 or 34 at block 176. LED 33 or 34 is pulsed at a first faster rate, such as ¾ second on, followed by ¾ second off. Of course, a variety of different time intervals could be selected for the first faster rate. Overload relay 79 is also closed to provide the overload signal at terminal 80. Load current continues to be monitored at block 177 to see if it has fallen below 550 A. If not, monitoring continues. If the load current is below 550 A, microprocessor 75 initiates pulsing LED 33 or 34 at a second slower rate, such as ¾ second on, followed by 2½ seconds off, as at block 178. As with the first faster rate, a variety of time intervals could be selected for the second slower rate. Microprocessor 75 then determines if load current again exceeds 600 A at block 179. If so, the 20 minute timer is started again at block 180. The load current is then monitored at block 181. If the current falls below 600 A, the 20 minute timer is reset at block 182 and the process returns to the start position. However, if 20 minutes expires with the load current above 600 A. at block 183, the LED 33 or 34 are again turned on at the faster rate at block 176 to indicate that the overload condition persists.

Returning to block 179, if the load current is below 600 A., block 184 decides whether 8 hours has expired. If not, LED 33 or 34 continues to be illuminated at the slower rate, indicative of a recent overload condition. If 8 hours has expired, block 185 terminates illumination of LED 33 or 34, clears the 8 hour timer and returns to the start position.

Rather than waiting for the predetermined reset time to elapse, fault indicator 20 may be manually reset at any time. To this end, a reset magnetic reed switch 120 is disposed in the housing 30 in FIG. 3, preferably at a generally perpendicular angle to conductor 21. Magnetic reed switch 120 may be manually closed with a permanent magnet tool in a manner known to the art.

While particular embodiments of the invention have been shown and described, it will be obvious to those skilled in the art that changes and modifications may be made therein without departing from the invention in its broader aspects.

What is claimed is:

1. A fault indicator for indicating the occurrence of a fault in an electrical conductor and for indicating an overload condition on said electrical conductor, said fault indicator comprising:
    a housing;
    a fault sensor for sensing the occurrence of a fault on said electrical conductor;
    a fault display for indicating that a fault has occurred, said fault display viewable from the exterior of the housing;
    a current sensor for sensing the current load in said conductor;
    an overload indicator for indicating that the current load on the conductor is above a predetermined overload value but less than the current load that causes the fault sensor to determine that a fault has occurred, said overload indicator viewable from the exterior of the housing, and
    a microprocessor in communication with said fault sensor to determine when a fault has occurred on said electrical conductor and to activate the fault display to a fault displaying condition, in communication with said current sensor to determine if the current load in the electrical conductor is above the predetermined overload value, to activate the overload indicator to an overload displaying condition if the current load is above the predetermined overload value, and to cease activating said overload indicator at a predetermined time after determining that the current load is below the predetermined overload value.

2. The fault indicator as defined in claim 1 wherein said overload indicator is activated when the current load in the electrical conductor remains above the predetermined overload value for a predetermined amount of time.

3. The fault indicator as defined in claim 1 wherein said overload indicator comprises a light emitting diode.

4. The fault indicator as defined in claim 3 wherein said microprocessor activates said light emitting diode at a first on/off rate during the overload condition and said microprocessor continues to activate said light emitting diode at a second on/off rate for a predetermined amount of time after said overload condition ends.

5. The fault indicator as defined in claim 4 wherein said first on/off rate of activating said light emitting diode is faster than said second on/off rate of activating said light emitting diode.

6. The fault indicator as defined in claim 1 wherein said microprocessor terminates activation of the overload indicator if the microprocessor determines that a fault has occurred on the electrical conductor.

7. The fault indicator as defined in claim 1 further comprising a current transformer, said current transformer electromagnetically coupled to said electrical conductor, and said current transformer supplying operating power for said fault indicator, including said microprocessor, said fault display and said light emitting diode.

8. The fault indicator as defined in claim 1 further comprising voltage in-rush restraint circuitry to inhibit said microprocessor from determining that a fault has occurred on said electrical conductor during voltage surges on the electrical conductor.

9. The fault indicator as defined in claim 1 further comprising current in-rush restraint circuitry to inhibit said microprocessor from determining that a fault has occurred on said electrical conductor during current in-rush conditions on the electrical conductor.

10. A fault indicator for indicating the occurrence of a fault in an electrical conductor and for indicating an overload condition on said electrical conductor, said fault indicator comprising:
    a housing;
    a fault sensor for sensing the occurrence of a fault on said electrical conductor;
    a fault display for indicating that a fault has occurred, said fault display viewable from the exterior of the housing;
    a current sensor for sensing the current load in said conductor;
    an overload indicator for indicating that the current load on the conductor is above a predetermined overload value but less than the current load that causes the fault sensor to determine that a fault has occurred, said overload indicator viewable from the exterior of the housing, and
    means for communicating with said fault sensor to determine when a fault has occurred on said electrical conductor and to activate the fault display to a fault displaying condition, means for communicating with said current sensor to determine if the current load in the electrical conductor is above the predetermined overload value, to activate the overload indicator to an overload displaying condition if the current load is above the predetermined overload value, and to cease activating said overload indicator at a predetermined time after determining that the current load is below the predetermined overload value.

11. The fault indicator as defined in claim 10 wherein said overload indicator is activated when the current load in the electrical conductor remains above the predetermined overload value for a predetermined amount of time.

12. The fault indicator as defined in claim 10 wherein said overload indicator comprises a light emitting diode.

13. The fault indicator as defined in claim 10 wherein said light emitting diode is activated at a first on/off rate during the overload condition and said light emitting diode is activated at a second on/off rate for a predetermined amount of time after said overload condition ends.

14. The fault indicator as defined in claim 13 wherein said first on/off rate of activating said light emitting diode is faster than said second on/off rate of activating said light emitting diode.

15. The fault indicator as defined in claim 10 wherein activation of the overload indicator is terminated if said means for communicating with the current sensor determines that a fault has occurred on the electrical conductor.

16. The fault indicator as defined in claim 10 further comprising a current transformer, said current transformer electromagnetically coupled to said electrical conductor, and said current transformer supplying operating power for said fault indicator, including said microprocessor, said fault display and said light emitting diode.

17. The fault indicator as defined in claim 10 further comprising voltage in-rush restraint circuitry to inhibit said means for communicating with the fault sensor from determining that a fault has occurred on said electrical conductor during voltage surges on the electrical conductor.

18. The fault indicator as defined in claim 10 further comprising current in-rush restraint circuitry to inhibit said means for communicating with the fault sensor from determining that a fault has occurred on said electrical conductor during current in-rush conditions on the electrical conductor.

* * * * *